(12) United States Patent
Raynor

(10) Patent No.: US 7,473,881 B2
(45) Date of Patent: Jan. 6, 2009

(54) IMAGE SENSOR

(75) Inventor: Jeffrey Raynor, Edinburgh (GB)

(73) Assignee: STMicroelectronics (Research and Development) Limited, Marlow (GB)

(*) Notice: Subject to any disclaimer, the term of this patent is extended or adjusted under 35 U.S.C. 154(b) by 125 days.

(21) Appl. No.: 11/419,044

(22) Filed: May 18, 2006

(65) Prior Publication Data
US 2006/0261255 A1 Nov. 23, 2006

(30) Foreign Application Priority Data
May 19, 2005 (EP) .................. 05253114

(51) Int. Cl.
H01L 27/00 (2006.01)
H03F 3/08 (2006.01)

(52) U.S. Cl. ............... 250/208.1; 250/214 R; 250/214 A; 348/302

(58) Field of Classification Search ............. 250/208.1, 250/214 R, 214 A; 348/300–302, 308; 257/291, 257/292, 443
See application file for complete search history.

(56) References Cited

U.S. PATENT DOCUMENTS

| 6,215,113 B1 | 4/2001 | Chen et al. ............... 250/208.1 |
| 6,423,582 B1* | 7/2002 | Fischer et al. ............... 438/132 |
| 2002/0017666 A1* | 2/2002 | Ishii et al. ................... 257/291 |
| 2005/0092895 A1* | 5/2005 | Fossum ................... 250/208.1 |
| 2005/0145777 A1* | 7/2005 | Barna et al. ............. 250/208.1 |

FOREIGN PATENT DOCUMENTS

WO 99/16238 4/1999

* cited by examiner

Primary Examiner—Stephen Yam
(74) Attorney, Agent, or Firm—Lisa K. Jorgenson; Allen, Dyer, Doppelt, Milbrath & Gilchrist P.A.

(57) ABSTRACT

The image sensor has a plurality of pixels arranged in rows and columns to form a pixel array, each pixel column having a column bitline. The image sensor includes a column readout for each column bitline and at least one additional column readout. The additional column readout may be selectively connected to one of the column bitlines. In one embodiment, a defective column readout can be isolated and the additional column readout used as a replacement.

18 Claims, 3 Drawing Sheets

IMAGE SENSOR

FIELD OF THE INVENTION

The present invention relates to the field of image sensing, and particularly to an image sensor with readout amplifier redundancy.

BACKGROUND OF THE INVENTION

There is an increasing tendency for larger number of pixels on image sensors used in devices such as digital still cameras, mobile phone cameras and optical pointing devices, for example. Consequently, sensors have either increased in size or pixels have been manufactured smaller, or often both. The use of finer geometry technologies increase the chance of defects occurring. Typically, the defectivity of an image sensor is proportional to the area.

Defects are caused during manufacture and are usually caused by dust particles obstructing the photolithography process. Resulting defects may be open circuit or short circuit connections. If a defect occurs within a pixel during manufacture, a defective pixel is usually the result. The defective pixel can be either ignored by the user or, if the defective pixel can be identified, corrected for by interpolating between neighboring pixels. If the defect occurs on a connection that is common to either a row or column of the pixel array, then a series of pixels in the row or column may be defective, rather than a single pixel. In some cases, the entire row or column can be defective. Defects that disrupt the operation of more than one pixel are far more noticeable to a user and much harder to compensate for.

Typically, as shown in FIG. 1, a pixel array 100 has a matrix of pixels 102. Each column of pixels 102 in the pixel array 100 is connected by a common column bitline 104. Each row of pixels 102 is connected by a common row select 106. When the row select 106 is activated (set to "high") by row drivers 108, the pixels 110 in that row are enabled for readout and the values of the pixels 102 are read out in parallel on to the column bitline 104 to readout amplifiers 110.

A horizontal scan 112 sends an "enable signal" along enable connection 114 to each readout amplifier 110 in turn. The amplified pixel value can then be read on an output bus 116. If the readout amplifier 110 is defective, the entire column of pixels cannot be readout correctly and, as such, a noticeable error occurs in the image.

U.S. Pat. No. 6,741,754 Hamilton, "Correcting for defects in a digital image taken by an image sensor caused by pre-existing defects in two pixels in adjacent columns of an image sensor", discloses a method for correcting for defects in a digital image taken by an image sensor when there are pre-existing defects in two pixels in adjacent columns of the image sensor which causes two adjacent lines of pixels in the digital image to have corrupted data.

U.S. Pat. No. 5,436,659, "Method and apparatus for determining defective pixel location", attempts to use digital timing techniques to identify defective pixels and store their locations for correction by an appropriate technique, such as substituting a neighboring pixel value. U.S. Pat. No. 5,291,293, "Electronic imaging device with defect correction", utilizes redundant sensor elements for defect compensation by using a plurality of arrays and pixels in one sensor used to correct info on the other sensor.

SUMMARY OF THE INVENTION

According to the present invention there is provided an image sensor having a plurality of pixels arranged in rows and columns to form a pixel array, each pixel column having a column bitline. The image sensor comprises a column readout for each column bitline and at least one additional column readout, wherein the at least one additional column readout may be selectively connected to one of the column bitlines.

Preferably, the at least one additional column readout may be selectively connected to one or more column bitlines by a first switch. Preferably, each column readout may be selectively disconnected from the respective column bitline by a second switch. Switches, in this context, include one-time on or off switches, such as fuses, as well as other types of switches which may be alternated between on and off.

In one embodiment, the first switch and the second switch are fuse links. In an alternative embodiment, the image sensor further comprises a configuration storage unit and the first switch is a first electronic device operable by the configuration storage unit. Preferably, the second switch is a second electronic device operable by the configuration storage unit.

Preferably, the configuration storage unit is connected by a first connection to one of the first or second electronic devices and the other of the first or second electronic devices is connected to an inverter which is also connected to the first connection. Preferably the first and second electronic devices are transistors and further preferably the transistors are PMOS or NMOS Field Effect Transistors (FETs).

According to a second aspect of the present invention there is provided an optical pointing device comprising an image sensor according to the first aspect of the invention. Preferably, the optical pointing device is an optical mouse.

According to a third aspect of the present invention there is provided a mobile device comprising an image sensor according to the first aspect of the invention. Preferably, the mobile device is one or more of the following: a mobile cellular telephone; a camera; a portable computer; a Personal Digital Assistant (PDA) or Palm device; or a Web Cam.

BRIEF DESCRIPTION OF THE DRAWINGS

Embodiments of the present invention will now be described, by way of example only, with reference to the accompanying drawings, in which.

DETAILED DESCRIPTION OF THE PREFERRED EMBODIMENTS

Figure 1:
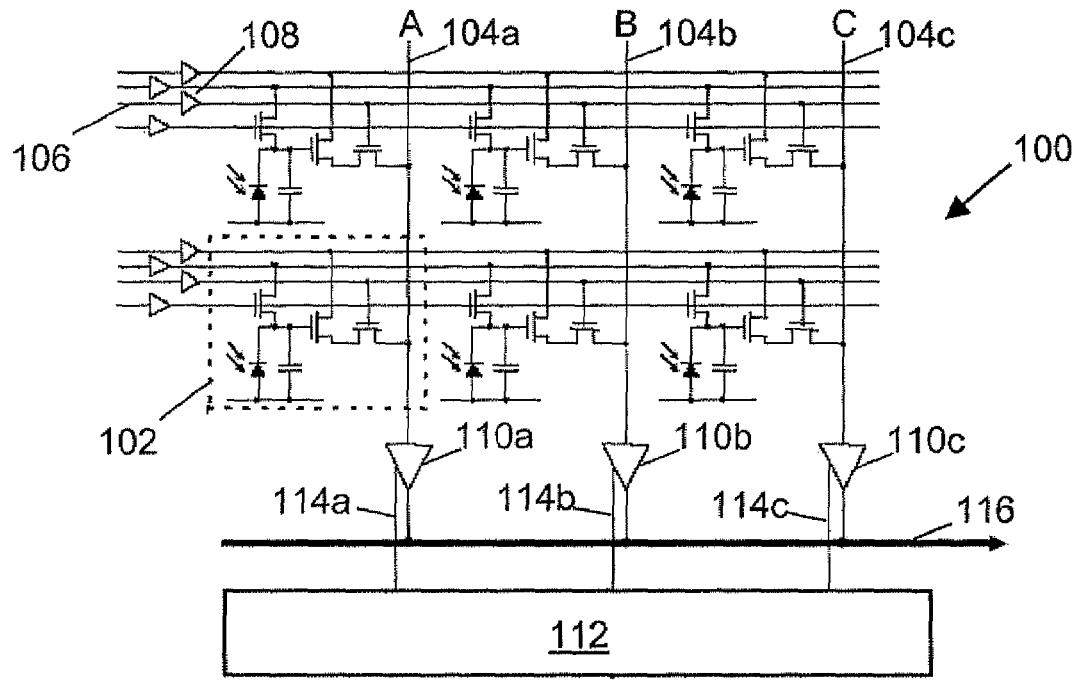
FIG. 1 is a schematic diagram illustrating a prior art image sensor having an array of pixels and readout circuitry.

Typically, two types of issues cause pixel column faults: problems connecting pixels in the readout ("bitline"); and defective column readout. "Column readout" is used as a generic term to describe pixel readout circuitry, which is usually on a per column basis. The column readout may be a simple voltage or charge amplifier; with modern technology, it usually incorporates an analog-digital converter (ADC). The column readout usually also has other processing, such as CDS (correlated double sampling) or other fixed-pattern noise or offset reduction methods. In the context of this invention, "column readout" includes any circuitry connected to a column bitline for reading pixel values.

With prior-art sensors, if there is a defective column readout circuit, either the whole sensor is declared defective, or the system forced to use some digital correction, which is never 100% transparent and requires post-processing. Post-processing requires additional circuitry, which ultimately increases cost and power usage.

With "low end" digital cameras, the cost of the image sensor is at a premium and so the sensor is designed to be a small as possible. The size of a pixel is often limited by the size of the column circuitry, so in this case there is no possibility to make the column narrower. Typically, the width of the column circuitry is in the region of 2 µm-5 µm.

In devices such as those found in the "professional consumer" market, including digital SLR (single lens reflex) cameras and also professional cameras, the image sensors are large (for example ⅓ or ½ or ⅔ the 35 mm format or larger). Pixels are also large to enable them to have a "large full well" and store a large number of electrons, thereby reducing photon shot noise. Photon shot noise is the most significant source of noise when the sensor is used on an illuminated scene. As dictated by quantum mechanics, the photons on the sensor follow a Poisson distribution. The Poisson distribution gives the variation in number (i.e. the noise in the signal) proportional to the square-root of the mean. Hence, the pixel's signal to noise ratio, which is the mean divided by the noise, is now proportional to the mean of the number of photons. Therefore, a less noisy pixel has a large capacity to store photons.

Increasing the full well results in pixels greater than the minimum column readout circuitry, usually a column amplifier, pitch. As these sensors are also large, they are expensive and yield enhancement techniques are especially desirable. Typical pixel width are 5 µm-30 µm. Column readout circuitry, and specifically the readout amplifier, due to its complexity and demanding specification, is unfortunately an area which has a high probability of defectivity.

The following embodiments are described with reference to readout amplifiers as the column readout circuitry. It should be appreciated that additional, and alternative, readout circuitry components may be present, such as those described previously. With prior-art sensors, a defective readout amplifier results in a defective column and hence a large number of defective pixels. Even more problematic, is that the defective pixels are grouped together, which produces a more noticeable error in a final image.

Figure 2:
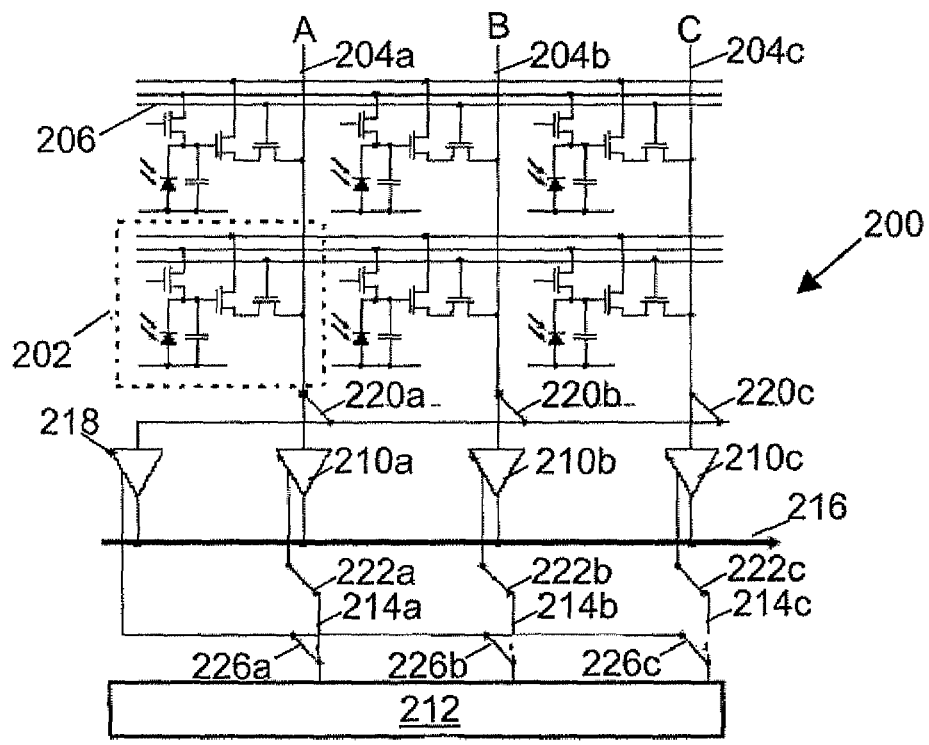
FIG. 2 is a schematic diagram illustrating an image sensor, according to one embodiment of the present invention, having an array of pixels, an additional readout device and a first configuration of fusable links.

Referring to FIG. 2, in an embodiment of the invention, a pixel array 200 has a matrix of pixels 202. Each column of pixels 202 in the pixel array 200 is connected by a common column bitline 204. Each row of pixels 202 is connected by a common row select 206. When the row select 206 is activated (set to "high") by row drivers (not shown), the pixels 210 in that row are enabled for readout and the values of the pixels 202 are read out in parallel on to the column bitline 204 to readout amplifiers 210.

A horizontal scan 212 sends an "enable signal" along a series of enable connections 214 to each readout amplifier 210 in turn. The amplified pixel value can then be read on an output bus 216. An additional readout amplifier 218 is connected to the bitlines 204 by first fuse links 220a, 220b, 220c. Furthermore, the enable connections 214 on each column have second fuse links 222a, 222b, 222c between the readout amplifiers 210 and the horizontal scan 212. The additional readout amplifier 218 has an additional enable connection 224 connected to the enable connections 214 by third fuse links 226a, 226b, 226c between the second fuse links 222a, 222b, 222c and the horizontal scan 212. The additional readout amplifier 218 is a "spare", which can be used if one of the other readout amplifiers 210 is defective.

During a programming phase, typically performed during a manufacturing test phase of the image sensor fabrication, the image sensor 100 is illuminated and images are acquired. These images are then analyzed to determine if there are defective columns, which may highlight a defective readout amplifier. If a defective column is located, then it can be bypassed by modifying the first, second and third fuse links. There are various ways of achieving this, one requires making fuse links with machines such as "Focused Ion Beams", but this tends to be rather slow and expensive. A more common technology is fusable links. These are fabricated as short-circuits during manufacture and can be programmed open by passing a high current which "blows the fuse". Another alternative would be to use short metal or polysilicon traces which are then cut by a high powered laser.

If, during the test phase, all the columns on the image sensor are found to be operational, then the links are set as shown in Table 1.

TABLE 1

Link settings where readout amplifiers are not defective

| LINK | OPEN/SHORT |
| --- | --- |
| 220a | OPEN |
| 220b | OPEN |
| 220c | OPEN |
| 222a | SHORT |
| 222b | SHORT |
| 222c | SHORT |
| 226a | OPEN |
| 226b | OPEN |
| 226c | OPEN |

If, for example, readout amplifier 210b is defective, then the fuse links would be set as in Table 2.

TABLE 2

Link settings where column B readout amplifier 210b is defective

| LINK | OPEN/SHORT |
| --- | --- |
| 220a | OPEN |
| 220b | SHORT |
| 220c | OPEN |
| 222a | SHORT |
| 222b | OPEN |
| 222c | SHORT |
| 226a | OPEN |

TABLE 2-continued

Link settings where column B readout amplifier 210b is defective

| LINK | OPEN/SHORT |
|------|------------|
| 226b | SHORT |
| 226c | OPEN |

With this pattern of link settings, column bitline 204b is disconnected from readout amplifier 210b and connected to the additional readout amplifier 218. The readout sequence is maintained as the enable connection 214b is also disconnected from the readout amplifier 210b and connected to the additional readout amplifier 218.

Figure 3:
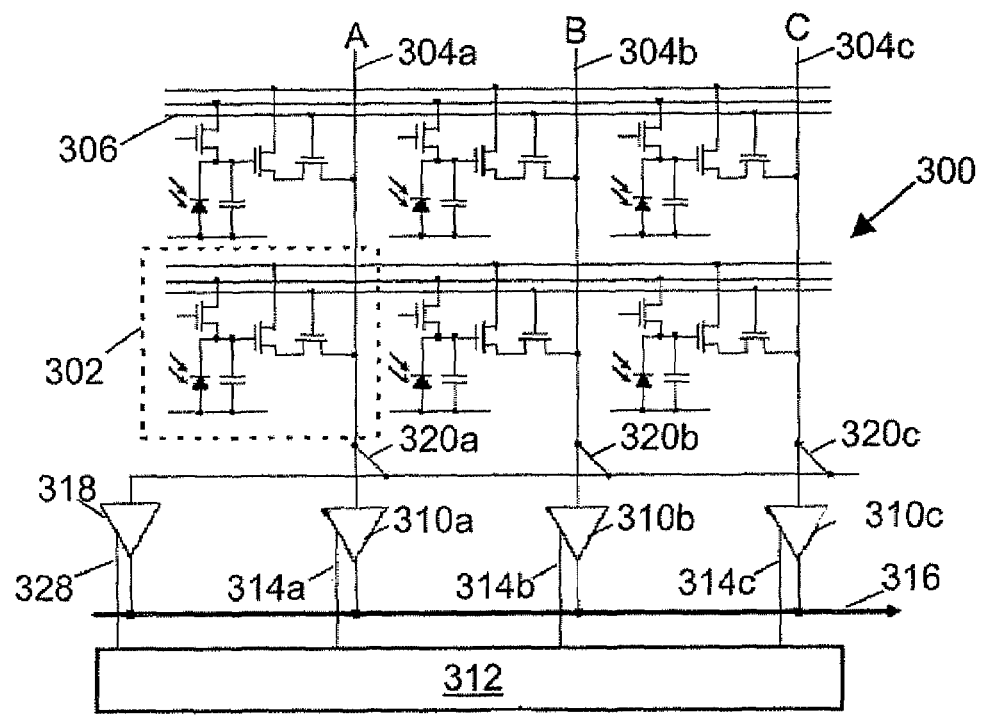
FIG. 3 is a schematic diagram illustrating an image sensor, according to another embodiment of the present invention, having an array of pixels, an additional readout device and a second configuration of fusable links.

An alternative embodiment of the invention is shown in FIG. 3. Once again, a pixel array 300 has a matrix of pixels 302. Each column of pixels 302 in the pixel array 300 is connected by a common column bitline 304a, 304b, 304c. Each row of pixels 302 is connected by a common row select 306. The values of the pixels 302 are read out in parallel on to the column bitline 304a, 304b, 304c and, consequently, to readout amplifiers 310a, 310b, 310c. A horizontal scan 312 sends an "enable signal" along a series of enable connections 314a, 314b, 314c to each readout amplifier 310a, 310b, 310c in turn. The amplified pixel value can then be read on an output bus 316. An additional readout amplifier 318 is connected to the bitlines 304a, 304b, 304c by first fuse links 320a, 320b, 320c.

In this embodiment of the invention, there is an additional enable connection 328 from the horizontal scan 312. Consequently, each readout amplifier 310a, 310b, 310c (including the additional readout amplifier 318) has its own enable signal and are therefore independent. Furthermore, the second and third fuse links of FIG. 2 are not required. In this case, the address sequence of the readout amplifiers must be generated to suit the defectivity.

If there are no defects in the readout amplifiers 310a, 310b, 310c, then the horizontal scan 312 enables the readout amplifiers in the following order: 310a, 310b then 310c. Fuse links 320a, 320b and 320c would be open. If there is a defect in readout amplifier 310b, then the horizontal scan 312 enables the readout amplifiers in the following order: 310a, 318 then 310c. Fuse links 320a and 320c would be open.

One method of enabling the horizontal scan 312 to modify the order in which it enables readout amplifiers is to have a RAM-based look-up table (LUT) incorporated into an address generator. Address generator circuitry is normal component in an image sensor and therefore would only require slight modification. The address of defective columns would be stored in the RAM. The address generator would increment as normal, but if it reached a value stored in the LUT, then the address of the additional readout amplifier would be used. If the number of columns in the image sensor were a power-of-two, the additional readout amplifier address would have a constant value for the lower number of bits, simplifying the implementation of the counter. Other methods of enabling the horizontal scan 312 to modify the order in which it enables readout would be apparent to those skilled in the art.

If the fuse links in the above embodiments are "one-time" fuse links, when testing for defective readout amplifiers, all the fuse links must be kept as short circuit during the sensor test. In the example in FIG. 2 and FIG. 3, keeping the fuse links as short circuit effectively puts three columns in parallel, degrading system performance by reducing the resolution of the system. In any case, the performance of the column amplifiers can still be assessed and the appropriate links blown.

Figure 4:
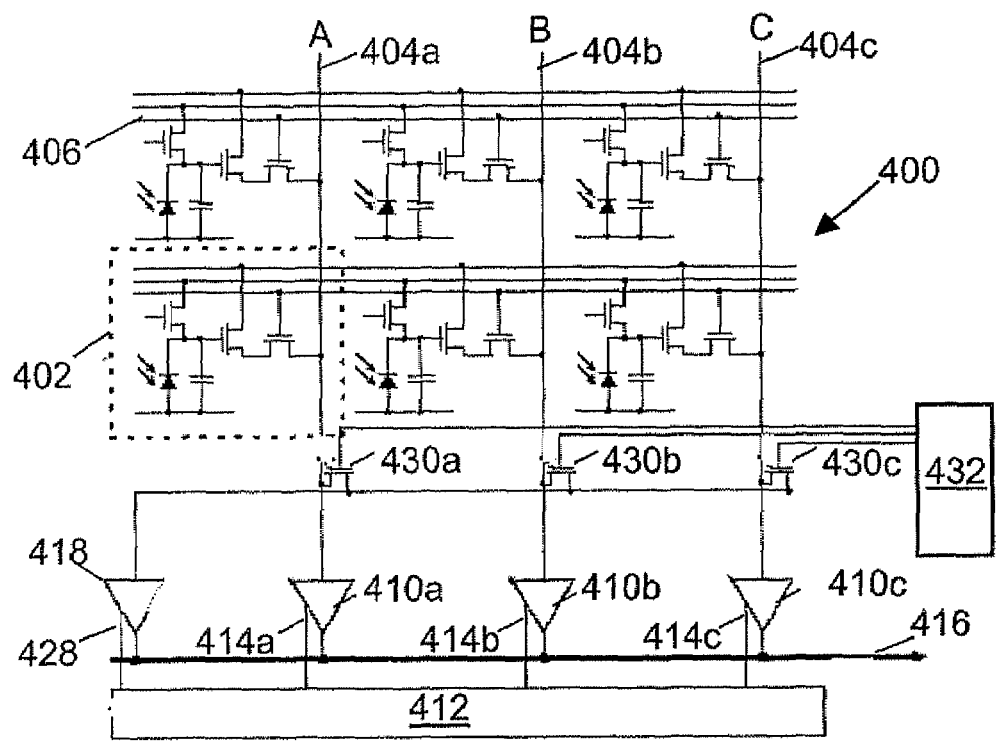
FIG. 4 is a schematic diagram illustrating an image sensor, according to another embodiment of the present invention, having an array of pixels, an additional readout device, a readout selection unit and a first configuration of a transistor switching unit.

An alternative embodiment is shown in FIG. 4. As before, a pixel array 400 has a matrix of pixels 402. Each column of pixels 402 in the pixel array 400 is connected by a common column bitline 404a, 404b, 404c. Each row of pixels 402 is connected by a common row select 406. The values of the pixels 402 are read out in parallel on to the column bitline 404a, 404b, 404c and, consequently, to readout amplifiers 410a, 410b, 410c. A horizontal scan 412 sends an "enable signal" along a series of enable connections 414a, 414b, 414c to each readout amplifier 410a, 410b, 410c in turn. The amplified pixel value can then be read on an output bus 416.

In this embodiment, an additional readout amplifier 418 is connected to the bitlines 404a, 404b, 404c by a switch. In this case, the switches are field effect transistors (FETs) 430a, 430b, 430c operated as switches. The FETs 430a, 430b, 430c are controlled by a configuration storage unit 432 connected to their gate. Typically, the configuration storage unit 432 is a static RAM, which is uploaded to the image sensor during power-on. As RAM can be written to several times, it is possible to set the initial configuration to disable the additional readout amplifier 418 and enable the readout amplifiers 410a, 410b, 410c. If a defective readout amplifier were detected, then the RAM contents would be changed to disable the defective readout amplifier by allowing the respective FET to conduct and thereby enable the additional readout amplifier 418. Although the FETs 430a, 430b, 430c shown in FIG. 4 are NMOS FETs, a PMOS FET, or other suitable device may be used. For example, if there is a wide voltage swing, then a CMOS transmission gate (NMOS in parallel with PMOS, their gates connected to opposite polarity signals) is the most effective, but also most area consuming.

If a defect is found and the additional readout amplifier 418 is used, then the input to the defective column amplifier is connected in parallel to the additional readout amplifier 418. If the readout amplifier has a high input impedance then this is not a problem. However, a readout amplifier's input usually incorporates an active load to facilitate the operation of the pixel's source-follower. In this case, having two inputs in parallel will effectively double the current through the pixel's output, leading to mismatch and other undesirable effects.

Figure 5:
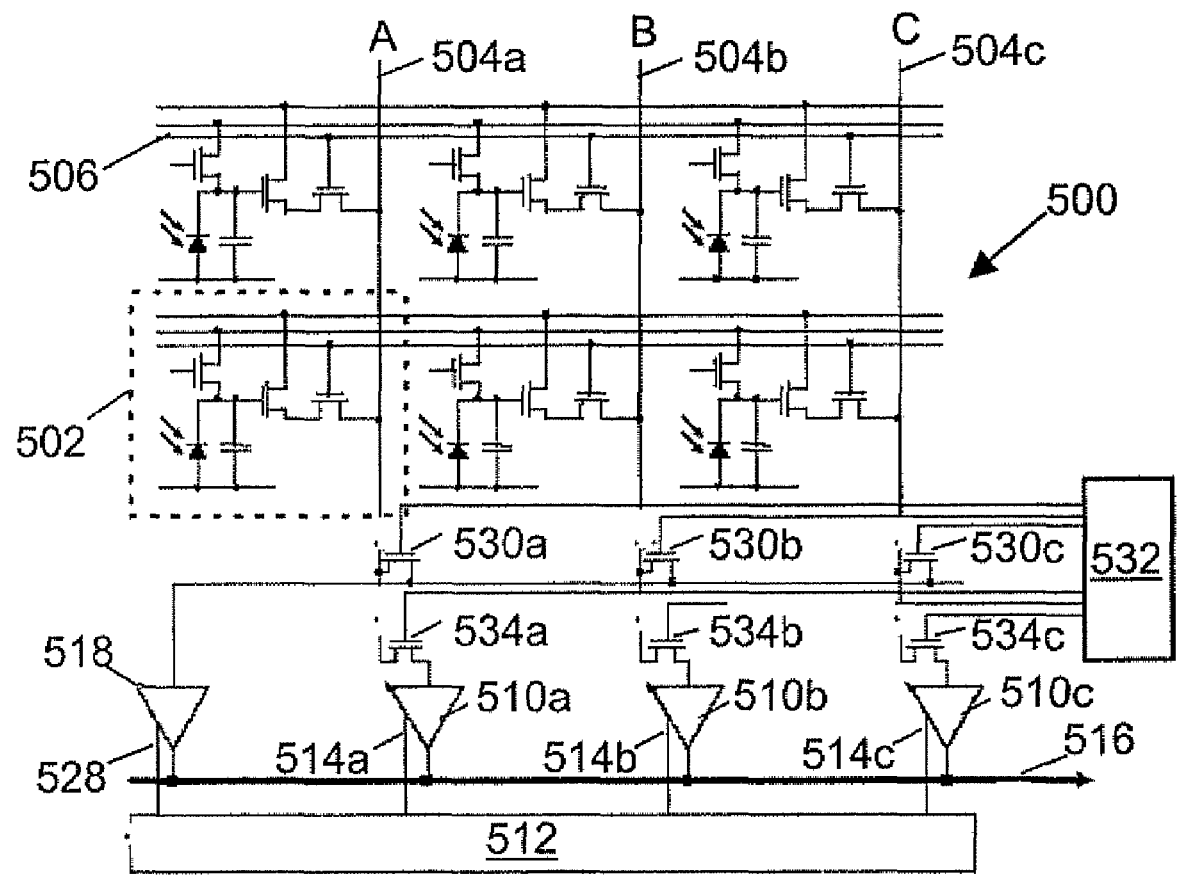
FIG. 5 is a schematic diagram illustrating an image sensor, according to another embodiment of the present invention, having an array of pixels, an additional readout device, a readout selection unit and a second configuration of a transistor switching unit.

An alternative embodiment is shown in FIG. 5. As before, a pixel array 500 has a matrix of pixels 502. Each column of pixels 502 in the pixel array 500 is connected by a common column bitline 504a, 504b, 504c. Each row of pixels 502 is connected by a common row select 506. The values of the pixels 502 are read out in parallel on to the column bitline 504a, 504b, 504c. A horizontal scan 512 sends an "enable signal" along a series of enable connections 514a, 514b, 514c to readout amplifiers 510a, 510b, 510c in turn. The amplified pixel value can then be read on an output bus 516. An additional readout amplifier 518 is connected to the bitlines 504a, 504b, 504c by first switches, which in this example are first FETs 530a, 530b, 530c.

Second switches, which in this example are second FETs 534a, 534b, 534c, connects the readout amplifiers 510a, 510b, 510c and the column bitlines 504a, 504b, 504c. A configuration storage unit 532 is connected to each gate of the first and second FETs enabling control of the connection between drain and source. If a defective readout amplifier is detected, then the readout amplifier can be isolated from the bitline avoiding loading the pixel with both the defective amplifier and the additional readout amplifier.

The configuration storage unit 532 may be increased in size, from that of the configuration storage means 432, to accommodate the extra storage required to accommodate the first and second FETs. In this configuration, when a first FET is switched "on", to connect a bitline with the additional readout amplifier 518, the second FET is switched "off", to disconnect the readout amplifier with the bitline. For example, if readout amplifier 510*a* is defective, first FET 530*a* is switched "on" and second FET 534*a* is switched off. Furthermore, it holds true that each second FET 534*a*, 534*b*, 534*c* will typically be switched as opposite to each first FET 530*a*, 530*b*, 504*c*.

As such, the configuration storage unit 532 only requires to store the configuration of one set of FETs. A simple inverter can then be used to connect the configuration storage unit 532 with the other set of FETs. For example, the configuration storage unit 532 is connected to the gate of first FET 530*a* and stores that the first FET 530*a* should be "off", or open, as the readout amplifier 510*a* is not defective. The gate of second FET 534*a* can then be connected to an inverter (not shown), which is then connected to the connection between the gate of the first FET 530*a* and the configuration storage unit 532.

In the embodiments described herein, three columns of pixels are shown in each case with one additional readout amplifier providing redundancy if a readout amplifier is defective. It should be appreciated that the invention allows for any combination of number of additional readout amplifiers to columns of pixels. Typically, this is dictated by the available space in the pixel array and relates to the width of the pixel in relation to the width of the readout amplifier. The present invention would also cover the situation where additional readout amplifiers where provided external to the pixel array.

Improvements and modifications may be incorporated without departing from the scope of the present invention.

The invention claimed is:

1. An image sensor comprising:
a plutality of pixels arranged in rows and columns to define a pixel array;
a column bitline for each pixel column;
a column readout for each column bitline;
at least one additional column readout selectively coupled to one of the column bitlines;
a first switch circuit to selectively couple the at least one additional column readout to one or more column bitlines;
a second switch circuit to selectively decouple each column readout from the respective column bitline;
a configuration storage unit to operate the first and second switch circuits;
a first connection coupling the configuration storage unit to one of the first and second switch circuits; and
an inverter coupled to the other of the first and second switch circuits and to the first connection.

2. The image sensor as claimed in claim 1, wherein the first switch circuit comprises a transistor.

3. The image sensor as claimed in claim 1, wherein the second switch circuit comprises a transistor.

4. The image sensor as claimed in claim 2, wherein the transistor comprises one of a PMOS and NMOS Field Effect Transistor (FET).

5. The image sensor as claimed in claim 3, wherein the transistor comprises one of a PKOS and NMOS Field Effect Transistor (FET).

6. The image sensor as claimed in claim 1, wherein the first switch circuit comprises at least one fuse link.

7. The image sensor as claimed in claim 1, wherein the second switch circuit comprises at least one fuse link.

8. The image sensor as claimed in claim 1, wherein the column readout comprises at least one of a readout amplifier, an analog-to-digital converter, a fixed pattern noise reduction unit and an offset reduction unit.

9. An electronic device comprising:
an image sensor including
a plurality of pixels arranged in rows and columns to define a pixel array,
a column bitline for each pixel column,
a column readout for each column bitline,
at least one additional column readout selectively coupled to one of the column bitlines,
a first switch circuit to selectively couple the at least one additional column readout to one or more column bitlines,
a second switch circuit to selectively decouple each column readout from the respective column bitline,
a configuration storage unit to operate the first and second switch circuits,
a first connection coupling the configuration storage unit to one of the first and second switch circuits, and
an inverter coupled to the other of the first and second switch circuits and to the first connection.

10. The electronic device as claimed in claim 9, wherein the first and second switch circuits each comprise at least one of a PMOS-FET, an NMOS-FET and a fuse link.

11. The electronic device as claimed in claim 9, wherein the column readout comprises at least one of a readout amplifier, an analog-to-digital converter, a fixed pattern noise reduction unit and an offset reduction unit.

12. The electronic device as claimed in claim 9, wherein the electronic device is an optical pointing device.

13. The electronic device as claimed in claim 12, wherein the optical pointing device is an optical mouse.

14. The electronic device as claimed in claim 9 wherein the electronic device is a mobile device.

15. The electronic device as claimed in claim 14, wherein the mobile device is at least one of a mobile cellular telephone, a camera, a portable computer, a Personal Digital Assistant (PDA) and a Web Cam.

16. A method of making an image sensor comprising:
arranging a plurality of pixels in rows and columns to define a pixel array;
providing a column bitline for each pixel column;
providing a column readout for each column bitline;
providing at least one additional column readout selectively coupled to one of the column bitlines;
selectively coupling the at least one additional column readout to one or more column bitlines with a first switch circuit;
selectively decoupling each column readout from the respective column bitline with a second switch circuit;
providing a configuration storage unit to operate the first and second switch circuits;
coupling the configuration storage unit to one of the first and second switch circuits at a first connection; and
coupling an inverter to the other of the first and second switch circuits and to the first connection.

17. The method as claimed in claim 16, wherein the first and second switch circuits each comprise at least one of a PMOS-PET, an NMOSFET and a fuse link.

18. The method as claimed in claim 16, wherein the column readout comprises at least one of a readout amplifier, an analog-to-digital converter, a fixed pattern noise reduction unit and an offset reduction unit.

* * * * *

UNITED STATES PATENT AND TRADEMARK OFFICE
CERTIFICATE OF CORRECTION

PATENT NO. : 7,473,881 B2
APPLICATION NO. : 11/419044
DATED : January 6, 2009
INVENTOR(S) : Jeffrey Raynor It is certified that error appears in the above-identified patent and that said Letters Patent is hereby corrected as shown below:

| | |
|---|---|
| Column 1, Line 10 | Delete: "There is an increasing tendency for larger number of pixels" <br> Insert: -- There is an increasing tendency for a larger number of pixels -- |
| Column 1, Line 16 | Delete: "use of finer geometry technologies increase the chance of" <br> Insert: -- use of finer geometry technologies increases the chance of -- |
| Column 3, Line 23 | Delete: "sensor is at a premium and so the sensor is designed to be a" <br> Insert: -- sensor is at a premium and so the sensor is designed to be as -- |
| Column 3, Line 47 | Delete: "and yield enhancement techniques are especially desirable." <br> Insert: -- and yield enhancement techniques that are especially desirable. -- |
| Column 6, Line 57 | Delete: "534a, 534b, 534c, connects the readout amplifiers 510a," <br> Insert: -- 534a, 534b, 534c, connect the readout amplifiers 510a, -- |
| Column 7, Line 9 | Delete: "530a, 530b, 504c." <br> Insert: -- 530a, 530b, 530c. -- |
| Column 7, Line 29 | Delete: "tional readout amplifiers where provided external to the pixel" <br> Insert: -- tional readout amplifiers are provided external to the pixel -- |

UNITED STATES PATENT AND TRADEMARK OFFICE
CERTIFICATE OF CORRECTION

PATENT NO. : 7,473,881 B2
APPLICATION NO. : 11/419044
DATED : January 6, 2009
INVENTOR(S) : Jeffrey Raynor It is certified that error appears in the above-identified patent and that said Letters Patent is hereby corrected as shown below:

Column 8, Line 61     Delete: "PMOS-PET, an NMOSFET and a fuse link."
                      Insert: -- PMOS-FET, an NMOS-FET and a fuse link. --

Signed and Sealed this

Twenty-eighth Day of July, 2009

JOHN DOLL
*Acting Director of the United States Patent and Trademark Office*